(12) United States Patent
Lee

(10) Patent No.: US 7,830,087 B2
(45) Date of Patent: Nov. 9, 2010

(54) ORGANIC ELECTROLUMINESCENT DEVICE HAVING AUXILIARY PATTERNS IN CAP BONDING AREA

(75) Inventor: Jae Hyuk Lee, Kyongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 957 days.

(21) Appl. No.: 11/387,853

(22) Filed: Mar. 24, 2006

(65) Prior Publication Data

US 2006/0261734 A1    Nov. 23, 2006

(30) Foreign Application Priority Data

May 17, 2005  (KR)  ...................... 10-2005-0041243
May 17, 2005  (KR)  ...................... 10-2005-0041245

(51) Int. Cl.
*H01J 1/62*    (2006.01)
(52) U.S. Cl. .................. 313/506; 313/504; 313/509; 313/512
(58) Field of Classification Search .......... 313/498–512
See application file for complete search history.

(56) References Cited

U.S. PATENT DOCUMENTS

| 2003/0080678 | A1* | 5/2003 | Kim et al. .................. 313/504 |
| 2003/0168966 | A1* | 9/2003 | Kobayashi et al. .......... 313/495 |
| 2003/0209786 | A1* | 11/2003 | Corisis et al. ............... 257/666 |
| 2004/0041520 | A1* | 3/2004 | Wu et al. ..................... 313/506 |
| 2004/0084740 | A1* | 5/2004 | Hayashi ...................... 257/432 |
| 2005/0012452 | A1* | 1/2005 | Kubota ........................ 313/504 |

* cited by examiner

*Primary Examiner*—Bumsuk Won
(74) *Attorney, Agent, or Firm*—Birch Stewart Kolasch & Birch, LLP

(57) ABSTRACT

The organic electroluminescent device having the structure capable of dispensing a sealant uniformly on the entire cap-bonding area of a substrate is disclosed. The electroluminescent display device according to the present invention comprises a substrate on which an active area is formed; a plurality of scan lines of a scan line group and a plurality of data lines of a data line group being respectively extended from cathode electrodes and anode electrodes formed in the active area; auxiliary patterns formed on the substrate, each auxiliary pattern being formed in a space between two adjacent line groups arranged on a cap-bonding area of the substrate; and a cap bonded to the cap-bonding area through a sealant.

18 Claims, 7 Drawing Sheets

ORGANIC ELECTROLUMINESCENT DEVICE HAVING AUXILIARY PATTERNS IN CAP BONDING AREA

BACKGROUND OF THE INVENTION

1. Field of the Invention

The present invention relates to an organic electroluminescent device, particularly to an organic electroluminescent device having the structure capable of dispensing a sealant uniformly on the entire cap-bonding area of a substrate.

2. Description of the Related Art

Organic electroluminescence is the phenomenon that excitons are formed in an (low molecular or high molecular) organic material thin film by re-combining holes injected through an anode with electrons injected through a cathode, and a light of specific wavelength is generated by energy from the formed excitons.

Organic electroluminescent device using the above phenomenon has the basic structure as shown in FIG. 1. The basic structure of organic electroluminescent device includes a glass substrate 1, indium-tin-oxide layers 2 (hereinafter, referred as "anode electrodes") formed on the glass substrate 1 and acting as anode electrode, an insulating layer, an organic electroluminescence layer 3 formed with organic material, and metal layers 4 (hereinafter, referred as "cathode electrodes") acting as cathode electrode. Walls W are formed to deposit the cathode electrodes 4 into a number of sections on the anode electrodes 2.

The structural elements constituting the organic electroluminescent device are well known in the field. Therefore, a detailed description thereon is omitted.

After the active area consisted of the structural elements 2, 3, 4 and W shown in FIG. 1 is formed, a cap 6 is bonded to a periphery of the substrate 1 by using a sealant 5. The area onto which the cap is bonded is an outer portion of the substrate 1, that is, an outer area of the active area. The active area is completely separated from the exterior by the cap 6, and only end portions of the anode electrodes 2 and the cathode electrodes 4 are exposed to the exterior.

As shown in FIG. 1, a sealed space is formed between the cap 6 and the substrate 1, and the structural elements 2, 3, 4 and W placed in this space are not influenced by the exterior environment such as moisture and the like. On the other hand, the cap 6 is made of glass or metal, and an ultraviolet rays-cured adhesive is used as the sealant 5. Also, a getter 8 of moisture absorbent is attached to the lower surface of the cap 6 by a tape 7 (made of organic material)

FIG. 2 is a plane view of the organic electroluminescent device. For convenience's sake, FIG. 2 shows a state that the cap 6 is removed from the organic electroluminescent device shown in FIG. 1. Also, in FIG. 2, the active area A consisted of the structural elements 2, 3, 4 and W shown in FIG. 1 is illustrated in the form of box.

As shown in FIG. 2, a plurality of anode electrodes 2 and a plurality of cathode electrodes 4 formed in the active area A are extended to an outer portion of the active area A, and the end portions of the extended anode electrodes 2 and cathode electrodes 4 (that is, data lines and scan lines) are concentrated at one region of the substrate 1 to form a pad section P.

Hereinafter, on the other hand, a plurality of data lines 2 and a plurality of scan lines 4 extended to an outer portion of the active area A are referred to as "the data line group 2A" and "the scan line group 4A," respectively.

The process for bonding the cap 6 to the substrate 1 as described above is briefly described with reference to FIG. 1 and FIG. 2 below.

After the getter 8 is attached to the cap 6 loaded on a cap tray (not shown), the sealant 5 is dispensed on the substrate-bonding area of the cap 6 (corresponding part to the cap-bonding areas S1 and S2 of an outer portion of the substrate 1) or the cap-bonding areas S1 and S2 of the substrate 1. After the substrate 1 and the cap 6 are aligned, the cap 6 is bonded to an outer portion S1 and S2 of the active area A formed on the substrate 1. And, in order to secure the bonding state of the cap 6, ultraviolet rays are radiated selectively onto the cap-bonding areas S1 and S2 of the substrate 1 to cure the sealant 5.

As shown in FIG. 2, the end portions of the scan line group 4A and the data line groups 2A are concentrated and arranged on the pad section P of the substrate 1, and certain space S is formed between the scan line group 4A and the data line group 2A at the cap-bonding area S1 of the substrate 1 adjacent to the pad section P as indicated by "K." However, this space S prevents the sealant from being uniformly dispensed.

FIG. 3 is a bottom view of the cap, and shows a state the sealant is dispensed on the lower surface of a periphery of the cap 6. In FIG. 3, the peripheries C1 and C2 on which the sealant 5 is dispensed correspond to the cap-bonding areas S1 and S2 of the substrate in FIG. 2.

In the process of dispensing the sealant 6 onto the cap 5 through a dispenser (not shown), the sealant 5 is not dispensed on each corner of the cap 6 due to the operational characteristic of the dispenser. In this state, when the cap 6 is pressurized to the substrate 1, the sealant 5 dispensed on the peripheries C1 and C2 is flowed toward each corner section. Accordingly, the sealant 5 is dispensed onto all peripheries of the cap 6 corresponding to the cap-bonding areas S1 and S2 of an outer portion of the active area A of the substrate 1 to bond the cap 6 and the substrate 1.

FIG. 4 is a partial sectional view of "K" section in FIG. 2, assuming that the sealant 5 is dispensed on the cap-bonding area S1 of the substrate 1. As illustrated there, the sealants dispensed by the dispenser is not dispensed on each corner section of the substrate 1, and the amount of sealant dispensed on the end portions of the cap-bonding area S1 is much less than other portion of the cap-bonding area.

In this state, when the cap 6 is pressurized to the substrate 1, the sealant 5 is flowed toward the end portion of the cap-bonding area S1 (the arrow direction in FIG. 5). In the course that the sealant 5 moves toward the end portion of the cap-bonding area S1 by pressure from the cap 6, the sealant 5 is flowed into the space S formed between the scan line group 4A and the data line group 2A, to fill the whole space S.

By filling the space S, the amount of the sealant 5 flowed toward the scan line group 4A is decreased, and the scan lines 4 act as an obstacle preventing flow of the sealant. Accordingly, the sealant cannot be dispensed uniformly onto both end portions of the cap-bonding area S1 of the substrate 1 (that is, the scan line groups 4A).

Although the cap 6 can be bonded to the substrate 1 under this condition, the space between the cap 6 and the substrate 1 is not completely sealed due to the area on which the sealant 5 is not dispensed, resulting in exposing the structural elements of the device to the exterior environment.

SUMMARY OF THE INVENTION

The present invention intends to solve the above problem occurred in the course of bonding a cap to a substrate. Thus, the object of the present invention is to provide an organic electroluminescent device having the structure capable of dispensing a sealant uniformly on all cap-bonding area of a substrate.

For achieving the above objects, an electroluminescent display device according to the present invention comprises a substrate on which an active area is formed; a plurality of scan lines (scan line group) and a plurality of data lines (data line group) extended from cathode electrodes and anode electrodes formed in the active area; auxiliary patterns formed on the substrate, each auxiliary pattern being formed in the space between two adjacent line groups arranged on a cap-bonding area of the substrate; and a cap bonded to the cap-bonding area through a sealant.

The auxiliary pattern is a metal layer formed on the substrate and the metal layer is made of one of indium tin oxide and molybdenum. Also, the auxiliary pattern can be consisted of a metal layer formed on the substrate and an insulating layer formed on the metal layer.

On the other hand, the auxiliary pattern is spaced apart from at least one line group by a predetermined gap or spaced apart from both line groups by a predetermined gap.

Here, the auxiliary pattern can be consisted of a plurality of unit patterns. At this time, it is desirable that the unit patterns are formed in the same direction as a flow direction of the sealant and spaced apart from each other.

BRIEF DESCRIPTION OF THE DRAWINGS

The present invention will be more clearly understood from the detailed description in conjunction with the following drawings.

DETAILED DESCRIPTON OF THE INVENTION

Hereinafter, embodiments of the present invention will be described in detail with reference to those accompanying drawings.

Figure 5:
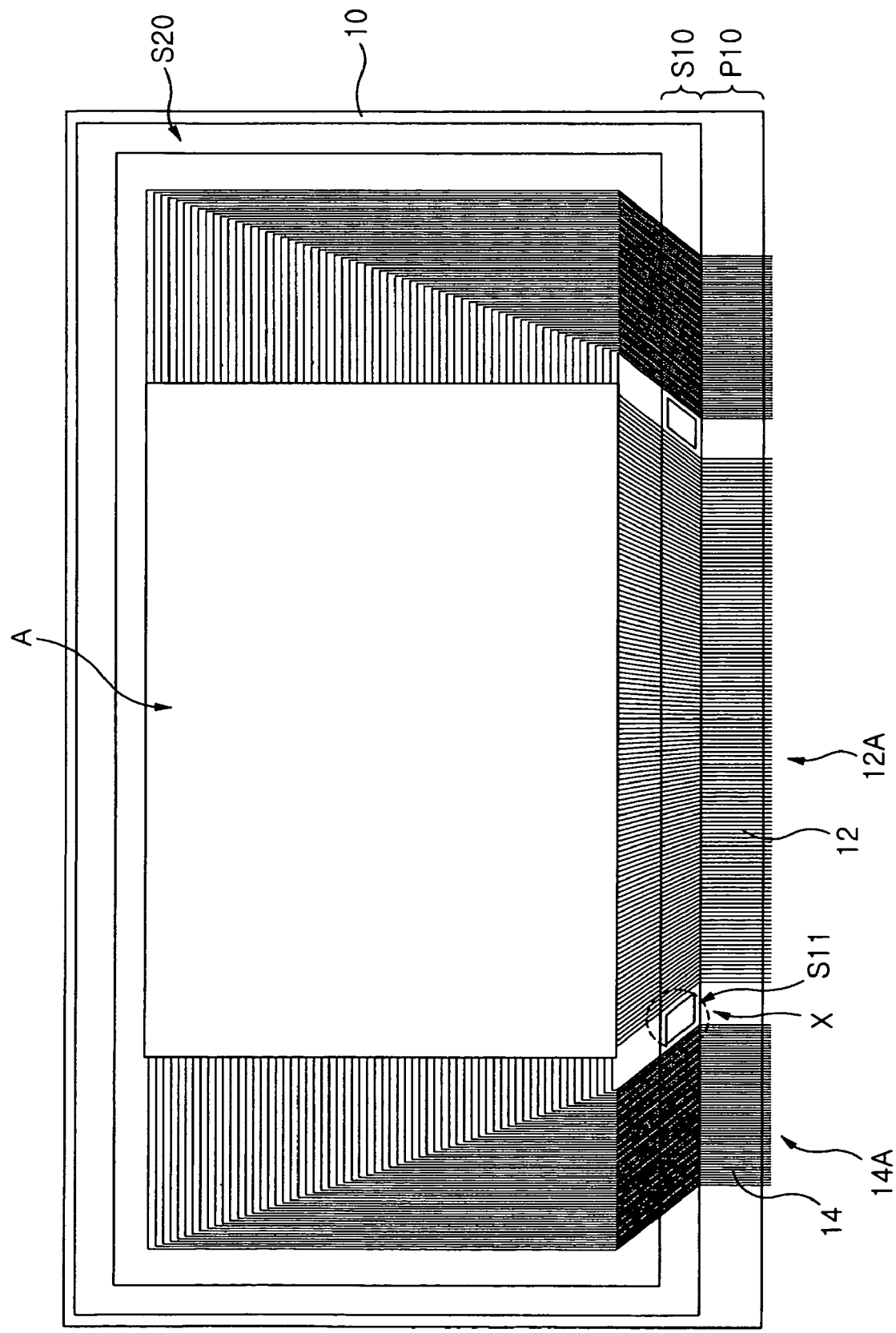
FIG. 5 is a plane view of a substrate constituting the organic electroluminescent device according to a first embodiment of the present invention.

FIG. 5 is a plane view of the organic electroluminescent device according to the first embodiment of the present invention. For convenience's sake, FIG. 5 shows the state that the cap is removed from the organic electroluminescent device, and an active area A consisted of the structural elements is illustrated in the form of box.

Figure 1:
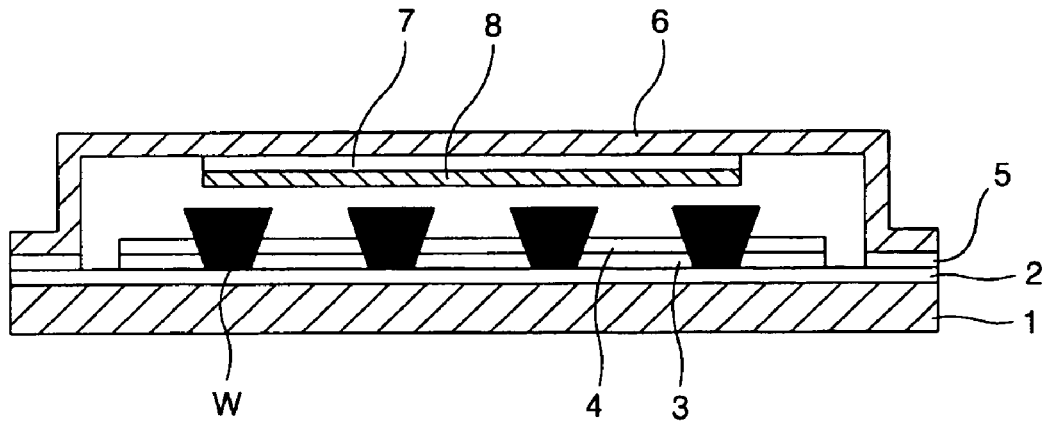
FIG. 1 is a sectional view schematically showing the basic structure of an organic electroluminescent device.
Figure 3:
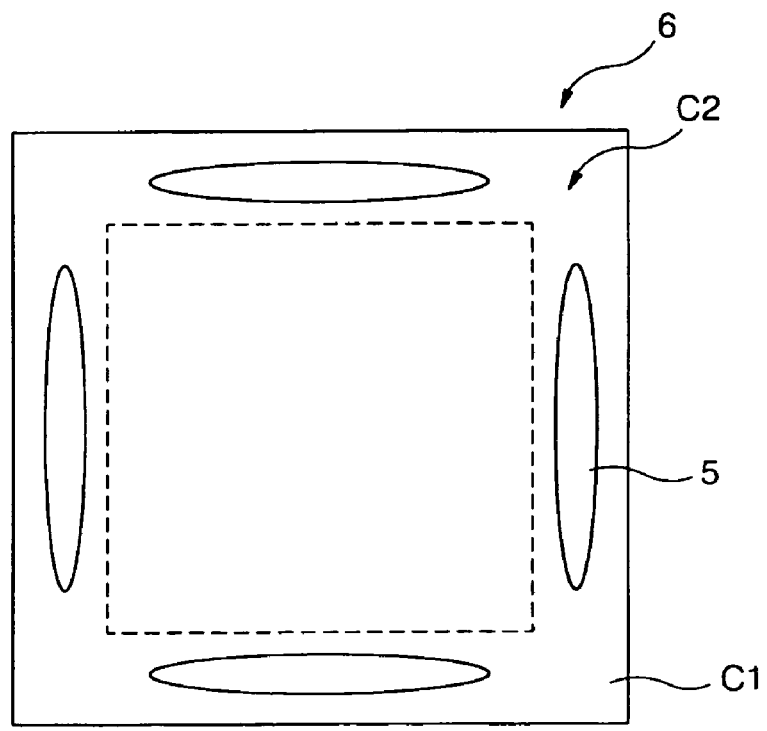
FIG. 3 is a bottom view of a cap.
Figure 2:
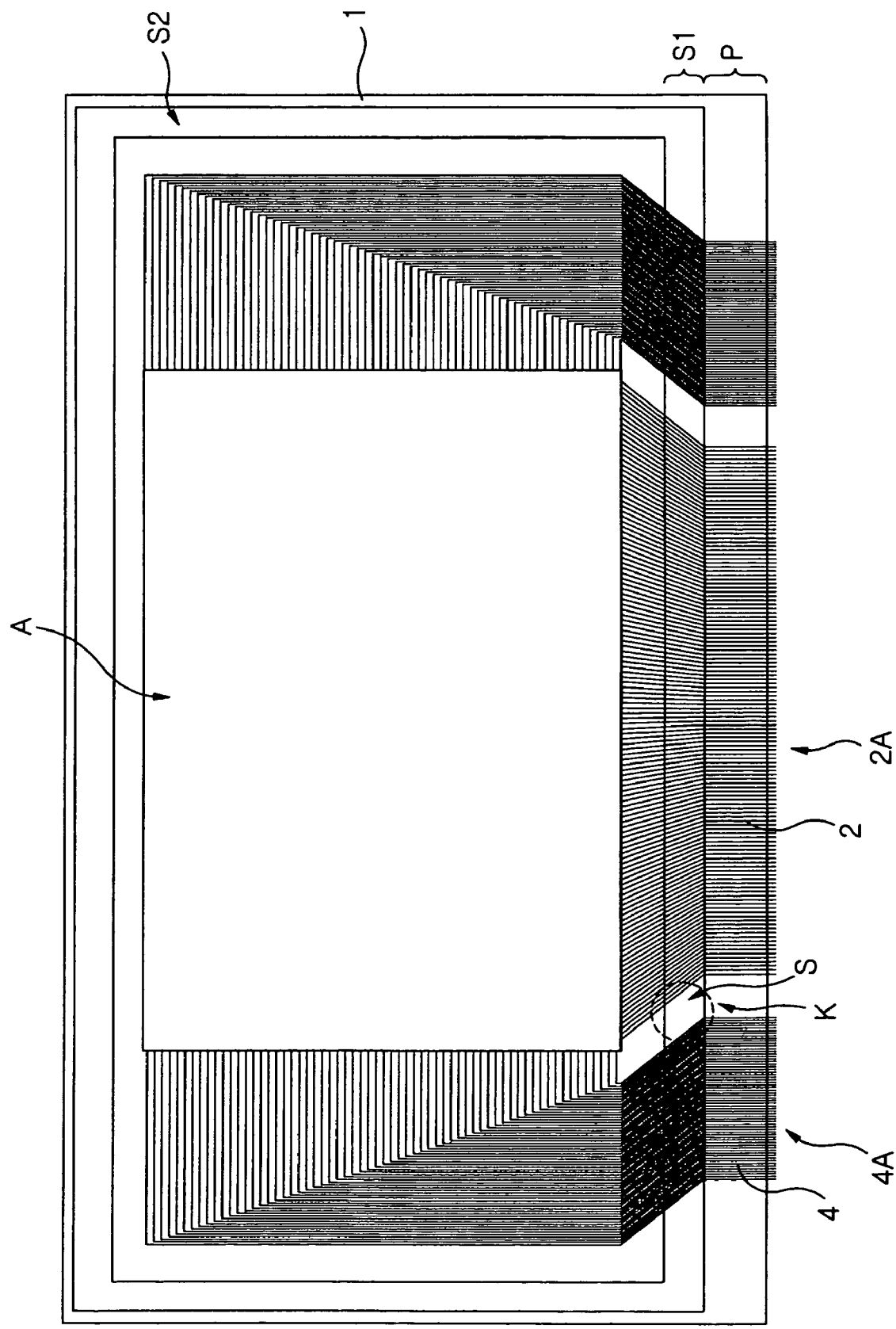
FIG. 2 is a plane view of a substrate constituting the organic electroluminescent device.

In the organic electroluminescent device according to the present invention, the structure of the active area consisted of anode electrodes, cathode electrodes and walls is the same as that of the organic electroluminescent device described in FIG. 1. Accordingly, the description thereon is omitted. Hereinafter, on the other hand, a plurality of anode electrodes 12 and a plurality of cathode electrodes 14 extended to an outer portion of the active area A are referred to as "data line group 12A" and "scan line group 14A", respectively.

Figure 6:
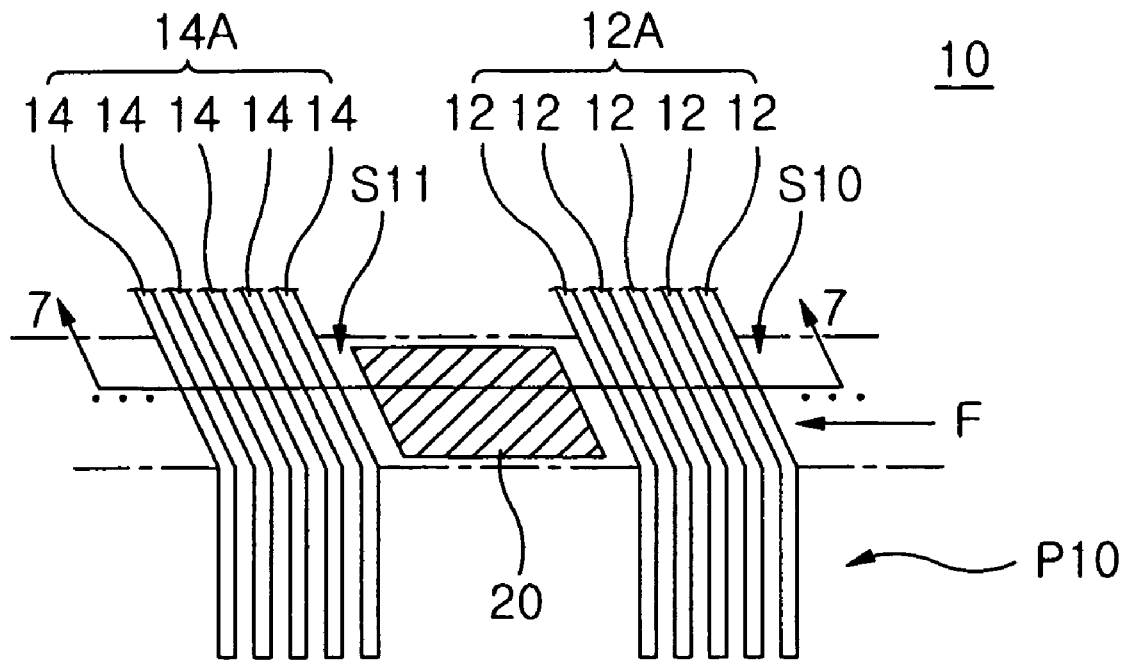
FIG. 6 is an enlarged partial view of part "X" in FIG. 5.

Also, FIG. 6 is an enlarged partial view of part "X" in FIG. 5, only illustrating an adjacent portion of the data line group 12A and the scan line group 14A in a cap-bonding area S10 adjacent to a pad section P10 of a substrate 10.

The most important feature of the organic electroluminescent device according to this embodiment is to form an auxiliary pattern 20 in the space S11 between the data line group 12A and the scan line group 14A (hereinafter, referred to as "space" for convenience's sake) in the cap-bonding area S10 adjacent to the pad section P10.

The auxiliary pattern 20 is a single pattern having a smaller area than the space S11. That is, the auxiliary pattern 20 is spaced apart from the data line group 12A and the scan line group 14A. The auxiliary pattern 20 is formed on the glass substrate 10, and so made of indium-tin-oxide (ITO) or molybdenum in order to be formed securely on the glass substrate 10 without separation.

Figure 7:
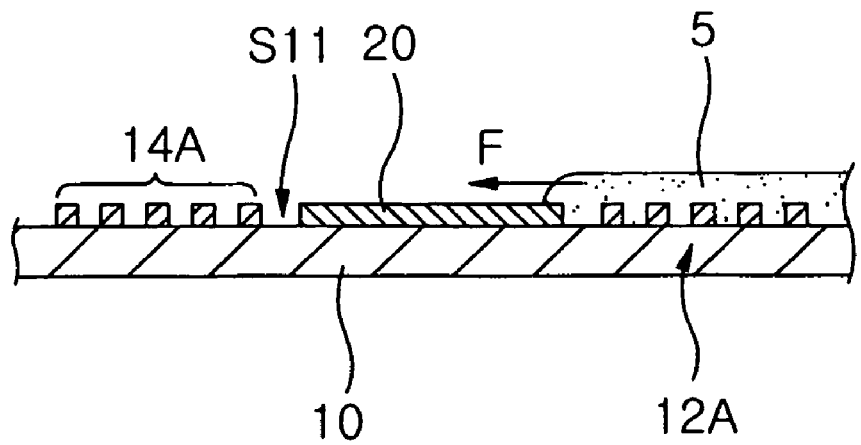
FIG. 7 is a sectional view taken along line 7-7 in FIG. 6.

As shown in FIG. 7 which is a sectional view taken along line 7-7 in FIG. 6, when the cap is pressurized toward the substrate 10, the sealant 5 dispensed on the cap-bonding area S10 adjacent to the pad section P10 is flowed toward the scan line group 14A past the space S11. In the flowing course of the sealant 5, the sealant 5 goes over the auxiliary pattern 20 to flow smoothly to the end portion of the cap-bonding area S10 (that is, the scan line group 14A).

Figure 4:
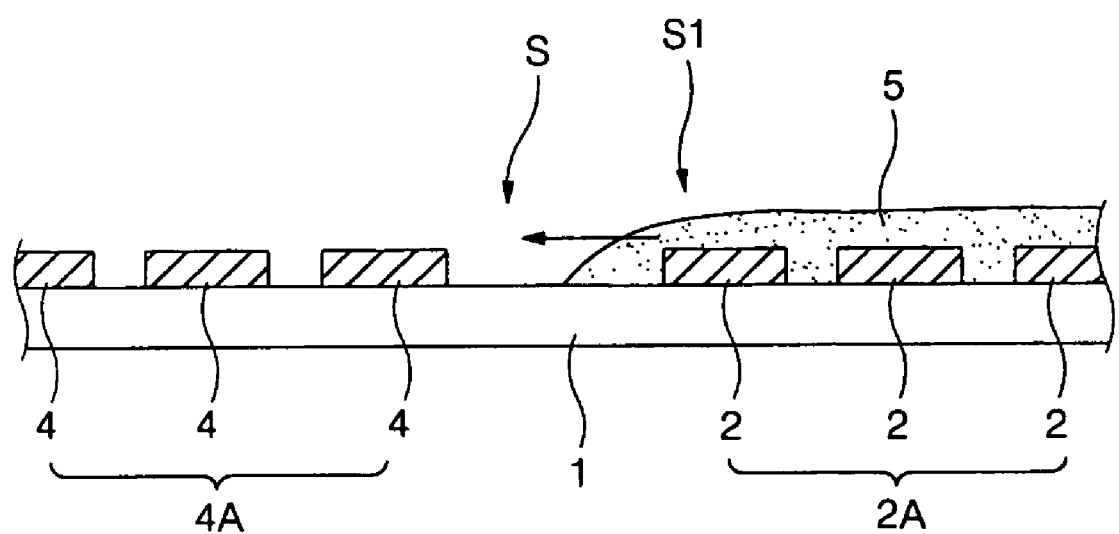
FIG. 4 is a partial sectional view of "K" section in FIG. 2, showing the state that a sealant is dispensed on a cap-bonding area of the substrate.

Here, compared with the structure in FIG. 4, the amount of the sealant 5 remained in the space S11 is decreased as much as the volume of the auxiliary pattern 20. Accordingly, the amount of the sealant as much as the volume of the auxiliary pattern 20 can be further flowed to the end portion of the cap-bonding area S10, and so the sealant can be dispensed on the entire cap-bonding area S10. Consequently, the cap (not shown in FIG. 6 and FIG. 7) can be bonded securely onto the entire surface of the cap-bonding area S10, and so the inner space formed by the cap is completely sealed.

On the other hand, a large amount of spacer is contained in the sealant. Thus, the spacer is contacted with the auxiliary pattern 20 of metal layer in the flowing course of the sealant. As a result, metallic particles are generated and remained in the sealant.

The metallic particles existing in the sealant has an adverse effect to the function of the device such as a short circuit of the scan lines 14. Accordingly, in order to prevent generation of the metallic particles, it is preferable to form the auxiliary pattern 20 with a metal layer and an insulating layer formed on the metal layer.

Also, in order to prevent the short circuit of the data line 12 and the scan line 14, a certain gap should be maintained between the data line group 12A and the auxiliary pattern 20, or between the scan line group 14A and the auxiliary pattern 20. Also, such gaps may be formed between the data line group 12A and the auxiliary pattern 20, and between the scan line group 14A and the auxiliary pattern 20.

Here, the spacer contained in the sealant is the element used for maintaining a predetermined gap between the cap and the substrate 10. Thus, the spacer can function well only when the auxiliary pattern 20 is formed shorter than the spacer contained in the sealant in the height.

As described above, on the other hand, in the case that the glass cap is bonded to the substrate, since the ultraviolet rays can penetrate the glass, the ultraviolet rays are radiated to the substrate 10 to cure the sealant. Accordingly, all the sealant dispensed onto the cap bonding area S10 can be cured completely regardless of the auxiliary pattern 20 located below the sealant.

Figure 8:
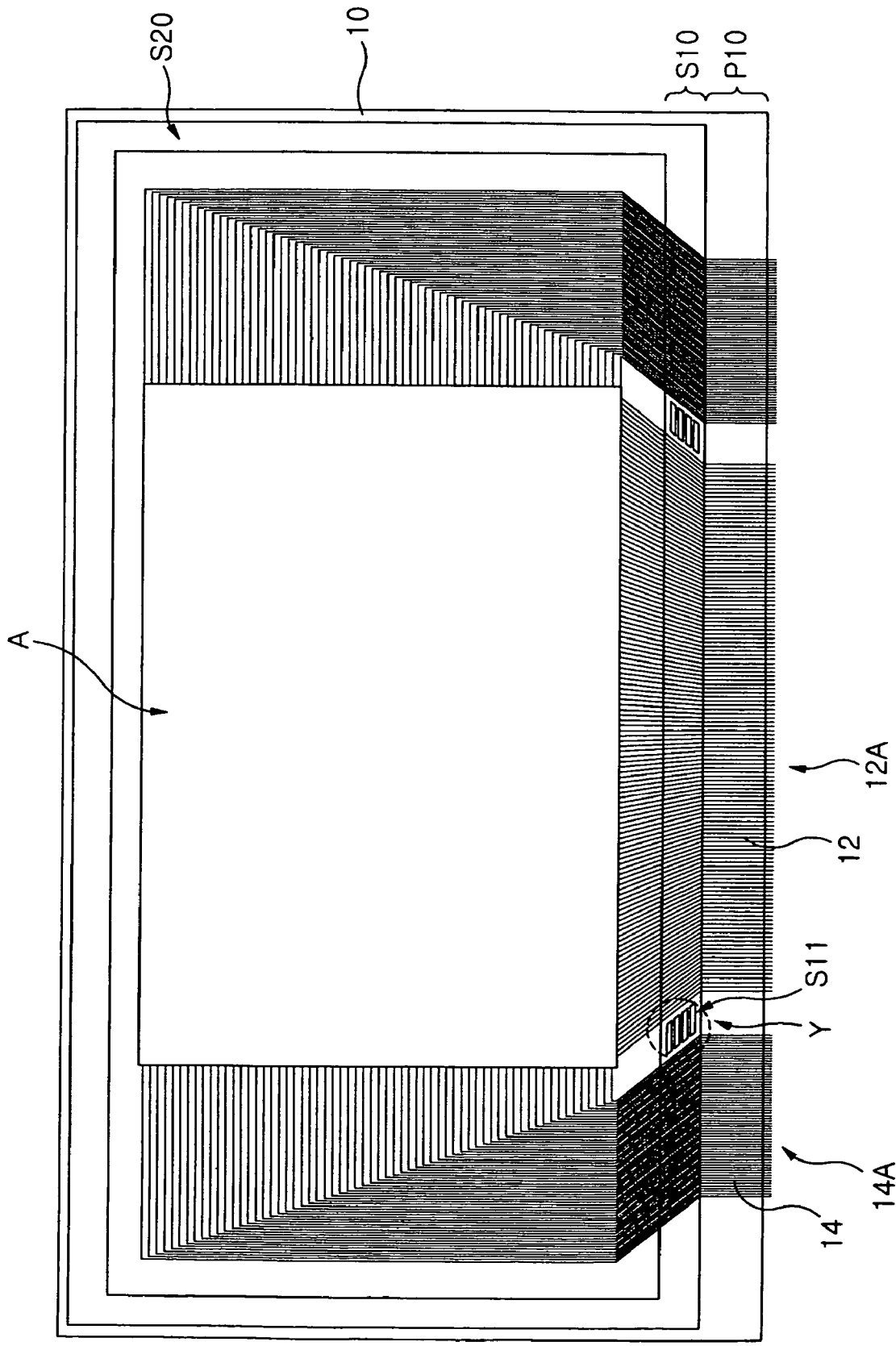
FIG. 8 is a plane view of a substrate constituting the organic electroluminescent device according to a second embodiment of the present invention.

FIG. 8 is a plane view of the organic electroluminescent device according to the second embodiment of the present invention. For convenience's sake, FIG. 8 does not illustrate the cap, and the active area A is illustrated in the form of box.

Figure 9:
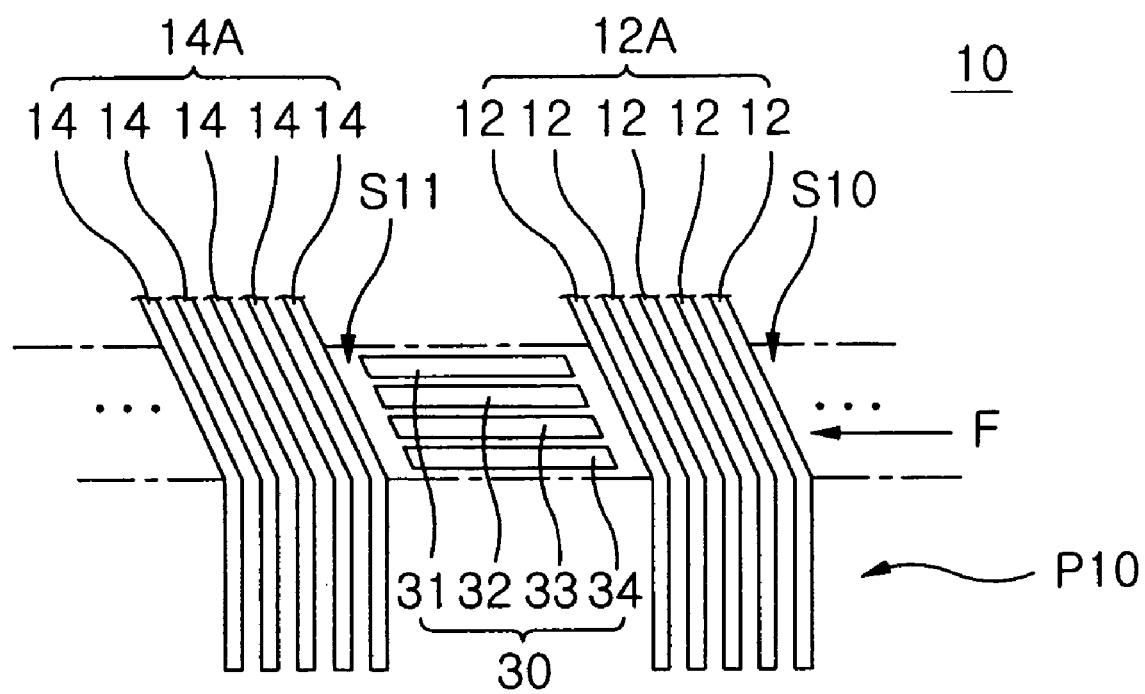
FIG. 9 is an enlarged partial view of part "Y" in FIG. 8.

Like FIG. 6, in FIG. 9 which is an enlarged partial view of part "Y" in FIG. 8, only an adjacent portion of the data line group 12A and the scan line group 14A in the cap-bonding area S10 adjacent to a pad section P10 of the substrate 10 is illustrated.

The most important feature of the organic electroluminescent device according to this embodiment is to form an auxiliary pattern 30 consisted of a plurality of unit patterns 31, 32, 33 and 34 in the space S11 between the data line group 12A and the scan line group 14A in the cap-bonding area S10 adjacent to the pad section P10.

The unit patterns 31, 32, 33 and 34 are formed in the same direction as the flow direction of the sealant (arrow F in FIG. 9) across the space S11. A predetermined gap is formed between the adjacent unit patterns.

The unit pattern 31, 32, 33 and 34 are formed on the glass substrate 10, and so made of indium-tin-oxide (ITO) or molybdenum in order to be formed securely on the glass substrate 10 without separation.

Like the condition as shown in FIG. 7, when the cap is pressurized toward the substrate 10, the sealant 5 dispensed on the cap-bonding area S10 adjacent to the pad section P10 goes past the space S11, and flows toward the scan line group 14A. In the flowing course of the sealant 5, the sealant 5 smoothly flows to the end portion of the cap-bonding area S10 (that is, the scan line group 14A) over the unit patterns 31, 32, 33 and 34.

Here, compared with the structure in FIG. 4, the amount of the sealant 5 remained in the space S11 is decreased as much as the volume of all the unit patterns 31, 32, 33 and 34 constituting the auxiliary pattern 30. Accordingly, the amount of the sealant as much as the volume of the auxiliary pattern 30 can be further flowed to the end portion of the cap-bonding area S10 so that the sealant can be dispensed on the entire cap-bonding area S10. Consequently, the cap (not shown in FIG. 8 and FIG. 9) can be bonded securely on the entire surface of the cap-bonding area S10, and so the inner space formed by the cap is completely sealed.

As described above, a large amount of spacer is contained in the sealant. Thus, the spacer is contacted with the unit patterns 31, 32, 33 and 34 of metal layers in the flowing course of the sealant. As a result, metallic particles are generated and remained in the sealant.

The metallic particles existing in the sealant affect adversely the function of the device such as a short circuit of the scan lines 14. Accordingly, in order to prevent generation of the metallic particles, it is preferable to form each of the unit patterns 31, 32, 33 and 34 with a metal layer and an insulating layer formed on the metal layer.

On the other hand, in order to prevent generation of the short circuit between the data line 12 and the scan line 14, a certain gap should be formed between the data line group 12A and the auxiliary pattern 30 (that is, the unit patterns 31, 32, 33 and 34), or between the scan line group 14A and the auxiliary pattern 30. Also, such gaps may be formed between the data line group 12A and the auxiliary pattern 30, and between the scan line group 14A and the auxiliary pattern 30.

Here, the spacer contained in the sealant is the element used for maintaining a predetermined interval between the cap and the substrate 10. Thus, the spacer can function well only if the unit patterns 31, 32, 33 and 34 are formed shorter than the spacer contained in the sealant in the height.

FIG. 9 shows the unit patterns 31, 32, 33 and 34 formed in the same direction as the flow direction of the sealant 5 (arrow F in FIG. 9) across the space S11, spaced apart from each other. The reason that the unit patterns 31, 32, 33 and 34 are arranged as shown above is as follows.

As described above, after the metal cap is bonded to the substrate through the dispensed sealant, the ultraviolet rays are radiated onto the lower surface of the substrate 10 to cure the sealant. The ultraviolet rays cannot penetrate metal material, and so cannot penetrate the unit patterns 31, 32, 33 and 34 containing ITO or molybdenum, either. If the auxiliary pattern 30 is formed as single pattern, the sealant dispensed onto the auxiliary pattern cannot be cured, and incomplete cure of the sealant has an adverse effect to subsequent processes and the device's function.

In this embodiment, in order to prevent the above mentioned problem, the auxiliary pattern 30 consists of a plurality of unit patterns 31, 32, 33 and 34 spaced apart from each other. Accordingly, the ultraviolet rays can pass through each gap between the adjacent unit patterns, to cure the sealant existing between the adjacent two unit patterns. In particular, the sealant existing on each unit pattern may be cured by diffused ultraviolet rays.

Also, a plurality of unit patterns 31, 32, 33 and 34 are formed in the same direction as the flow direction of the sealant 5 (arrow F in FIG. 9) across the space S11, and so the sealant can be flowed smoothly to the end portion of the cap-bonding area S10 without any hindrance.

In the organic electroluminescent device according to the present invention as described above, the sealant is dispensed uniformly on the entire cap-bonding area so that the glass cap or the metal cap can be bonded securely to the entire cap-bonding area of the substrate. Consequently, all the elements of the device are separated completely from the exterior environment, and so reliability of the device can be enhanced.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An organic electroluminescent device comprising:
a substrate on which an active area is formed;
a plurality of cathode electrodes and a plurality of anode electrodes formed in the active area;
a scan line group and a data line group extended from the cathode electrodes and the anode electrodes, respectively;
auxiliary patterns formed on the substrate, wherein each auxiliary pattern is formed in a space between the scan line group and the data line group, and arranged on a cap-bonding area of the substrate; and
a cap bonded to the cap-bonding area through a sealant, wherein the auxiliary pattern is a metal layer formed on the substrate.

2. The organic electroluminescent device according to claim 1, wherein the metal layer is made of one of indium tin oxide and molybdenum.

3. The organic electroluminescent device according to claim 1, wherein an insulating layer formed on the metal layer.

4. The organic electroluminescent device according to claim 3, wherein the metal layer is made of one of indium tin oxide and molybdeum.

5. The organic electroluminescent device according to claim 1, wherein a height of the auxiliary pattern is shorter than a height of a spacer contained in the sealant.

6. The organic electroluminescent device according to claim 1, wherein the auxiliary pattern is spaced apart from at least one line group by a predetermined gap.

7. The organic electroluminescent device according to claim 1, wherein the auxiliary pattern is spaced apart from both line groups by a predetermined gap.

8. The organic electroluminescent device according to claim 1, wherein the auxiliary pattern consists of at least two unit patterns.

9. The organic electroluminescent device according to claim 8, wherein the unit patterns are formed in the same direction as a flow direction of the sealant and spaced apart from each other.

10. An organic electroluminescent device, comprising;
a substrate on which an active area is formed;
a plurality of cathode electrodes and a plurality of anode electrodes formed in the active area;
a scan line group and a data line group extended from the cathode electrodes and the anode electrodes, respectively;
auxiliary patterns formed on the substrate, wherein each auxiliary pattern consists of at least two unit patterns formed in a space between the scan line group and the data line group, and arranged on a cap-bonding area of the substrate; and
a cap bonded to the cap-bonding area through a sealant, wherein the unit pattern is a metal layer formed on the substrate.

11. The organic electroluminescent device according to claim 10, wherein the metal layer is made of one of indium tin oxide and molybdenum.

12. The organic electroluminescent device according to claim 10, wherein an insulating layer formed on the metal layer.

13. The organic electroluminescent device according to claim 12, wherein the metal layer is made of one of indium tin oxide and molybdeum.

14. The organic electroluminescent device according to claim 10, wherein a height of the unit pattern is shorter than a height of a spacer contained in the sealant.

15. The organic electroluminescent device according to claim 10, wherein the unit patterns are formed in the same directions as a flow direction of the sealant and spaced apart from each other.

16. The organic electroluminescent device according to claim 10, wherein the unit pattern is spaced apart from at least one line group by a predetermined gap.

17. The organic electroluminescent device according to claim 10, wherein the unit pattern is spaced apart from both line groups by a predetermined gap.

18. The organic electroluminescent device according to claim 10, wherein the cap is made of glass or metal.

* * * * *